(12) United States Patent
Lee et al.

(10) Patent No.: US 9,673,413 B2
(45) Date of Patent: Jun. 6, 2017

(54) ORGANIC LIGHT-EMITTING DEVICE AND DISPLAY APPARATUS INCLUDING THE SAME

(71) Applicant: SAMSUNG DISPLAY CO., LTD., Yongin, Gyeonggi-Do (KR)

(72) Inventors: Sunhye Lee, Suwon-si (KR); Wonjun Song, Hwaseong-si (KR); Jae Bok Kim, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 12 days.

(21) Appl. No.: 14/718,395

(22) Filed: May 21, 2015

(65) Prior Publication Data

US 2016/0164018 A1     Jun. 9, 2016

(30) Foreign Application Priority Data

Dec. 8, 2014   (KR) .......................... 10-2014-0174817

(51) Int. Cl.
*H01L 51/50*   (2006.01)
(52) U.S. Cl.
CPC ................................. *H01L 51/508* (2013.01)
(58) Field of Classification Search
CPC ............... H01L 51/508; H01L 51/5004; H01L 51/5012; H01L 51/5092; H01L 27/3244
See application file for complete search history.

(56) References Cited

U.S. PATENT DOCUMENTS

| | | | |
|---|---|---|---|
| 6,097,147 A | 8/2000 | Baldo et al. | |
| 2009/0167159 A1* | 7/2009 | Song | H01L 51/5048 313/504 |
| 2011/0240965 A1* | 10/2011 | Yoon | H01L 27/3211 257/40 |
| 2016/0164018 A1* | 6/2016 | Lee | H01L 51/508 257/40 |

FOREIGN PATENT DOCUMENTS

| | | |
|---|---|---|
| KR | 10-2010-0043994 A | 4/2010 |
| KR | 10-2012-0073271 | 7/2012 |
| KR | 10-2012-0078298 A | 7/2012 |
| KR | 10-2013-0135161 A | 12/2013 |
| KR | 10-2014-0059713 A | 5/2014 |
| KR | 10-2015-0012548 A | 2/2015 |

* cited by examiner

*Primary Examiner* — John P Dulka
*Assistant Examiner* — Christina Sylvia
(74) *Attorney, Agent, or Firm* — Lee & Morse, P.C.

(57) ABSTRACT

An organic light-emitting device including a first electrode, a hole transport region on the first electrode, a light-emitting layer on the hole transport region, an electron transport region on the light-emitting layer, and a second electrode on the electron transport region. The electron transport region includes a first mixed electron transport layer and a second mixed electron transport layer on the first mixed electron transport layer. The first mixed electron transport layer includes a first electron transport compound and a second electron transport compound different from the first electron transport compound. The second mixed electron transport layer includes the first electron transport compound and a third electron transport compound different from the first electron transport compound and the second electron transport compound.

20 Claims, 5 Drawing Sheets

ORGANIC LIGHT-EMITTING DEVICE AND DISPLAY APPARATUS INCLUDING THE SAME

CROSS-REFERENCE TO RELATED APPLICATION

Korean Patent Application No. 10-2014-0174817, filed on Dec. 8, 2014, in the Korean Intellectual Property Office, and entitled: "Organic Light-Emitting Device and Display Apparatus Including The Same," is incorporated by reference herein in its entirety.

BACKGROUND

1. Field

Embodiments relate to an organic light-emitting device and a display apparatus including the same.

2. Description of the Related Art

Flat display devices may be classified into two main groups, light-emitting type flat display devices and light-receiving type flat display devices. Examples of the light-emitting type flat display devices are a flat cathode ray tube, a plasma display panel, an organic light-emitting display (OLED) and the like. The OLED is a self-luminous display apparatus, and has advantages such as wide viewing angle, excellent contrast, and rapid response.

The organic light-emitting device is applicable to a display apparatus for mobile devices, such as a digital camera, a video camera, a portable information terminal, a smartphone, an ultra-slim notebook, a tablet personal computer, and a flexible device, to a large-sized electronic product such as an ultra-thin television, or to a large-sized electrical product.

The organic light-emitting device generates colors by using a principle in which holes and electrons injected from a first electrode and a second electrode are re-combined in a light-emitting layer to emit light. Here, the injected holes and the injected electrons are combined to generate excitons, and the excitons are transited from an excited state to a ground state to emit light.

SUMMARY

Embodiments are directed to an organic light-emitting device including a first electrode, a hole transport region on the first electrode, a light-emitting layer on the hole transport region, an electron transport region on the light-emitting layer, and a second electrode on the electron transport region. The electron transport region includes a first mixed electron transport layer and a second mixed electron transport layer on the first mixed electron transport layer. The first mixed electron transport layer includes a first electron transport compound and a second electron transport compound different from the first electron transport compound. The second mixed electron transport layer includes the first electron transport compound and a third electron transport compound different from the first electron transport compound and the second electron transport compound.

The first electron transport compound may be at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq2), and 9,10-di(naphthalene-2-yl)anthracene (ADN).

Each of the second electron transport compound and the third electron transport compound may be at least one of LiF, lithium quinolate (LiQ), Li$_2$O, BaO, NaCl, CsF, Yb, RbCl, and RbI.

A highest occupied molecular orbital (HOMO) value of the first electron transport compound may be greater than a HOMO value of the second electron transport compound.

A lowest occupied molecular orbital (LUMO) value of the third electron transport compound may be greater than a LUMO value of the first electron transport compound.

The electron transport region may further include an electron injection layer on the second mixed electron transport layer.

A LUMO value of a compound included in the electron injection layer may be greater than a LUMO value of the third electron transport compound.

The electron injection layer may include at least one selected from the group of LiF, lithium quinolate (LiQ), Li$_2$O, BaO, NaCl, CsF, Yb, RbCl, RbI, a metal acetate, a metal benzoate, a metal acetoacetate, a metal acetylacetonate, and a metal stearate.

The hole transport region may include a hole injection layer on the first electrode and a hole transport layer on the hole injection layer.

Embodiments are also directed to a display apparatus including a plurality of pixels. At least one of the plurality of pixels includes, a first electrode, a hole transport region on the first electrode, a light-emitting layer on the hole transport region, an electron transport region on the light-emitting layer, and a second electrode on the electron transport region. The electron transport region includes a first mixed electron transport layer, and a second mixed electron transport layer on the first mixed electron transport layer. The first mixed electron transport layer may include a first electron transport compound, and a second electron transport compound different from the first electron transport compound. The second mixed electron transport layer may include the first electron transport compound and a third electron transport compound different from each of the first electron transport compound and the second electron transport compound.

The first electron transport compound may be at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq2), and 9,10-di(naphthalene-2-yl)anthracene (ADN).

Each of the second electron transport compound and the third electron transport compound may be at least one of LiF, lithium quinolate (LiQ), Li$_2$O, BaO, NaCl, CsF, Yb, RbCl, and RbI.

A highest occupied molecular orbital (HOMO) value of the first electron transport compound may be greater than a HOMO value of the second electron transport compound.

A lowest occupied molecular orbital (LUMO) value of the third electron transport compound may be greater than a LUMO value of the first electron transport compound.

The electron transport region may further include an electron injection layer on the second mixed electron transport layer.

A LUMO value of a compound included in the electron injection layer may be greater than a LUMO value of the third electron transport compound.

The electron injection layer may include at least one selected from the group of LiF, lithium quinolate (LiQ), $Li_2O$, BaO, NaCl, CsF, Yb, RbCl, RbI, metal acetate, metal benzoate, metal acetoacetate, metal acetylacetonate, and metal stearate.

The hole transport region may include a hole injection layer on the first electrode and a hole transport layer on the hole injection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
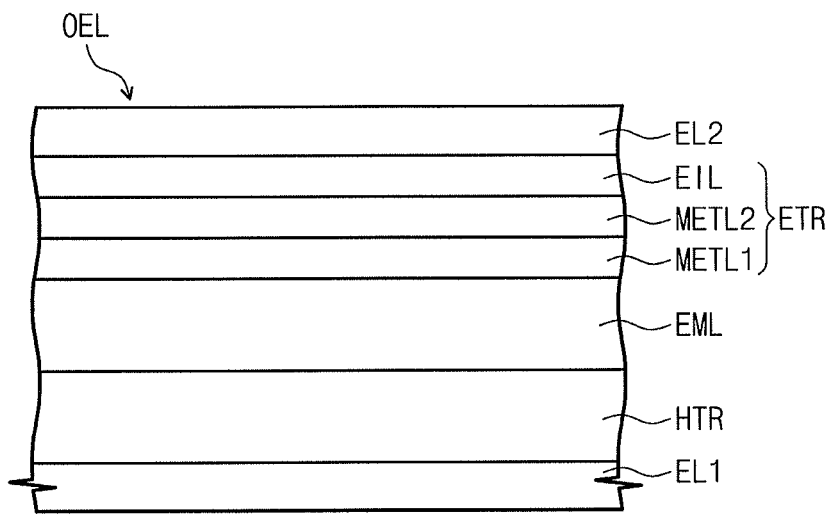
FIG. 1 illustrates a schematic view depicting an organic light-emitting device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Hereinafter, an organic light-emitting device according to an embodiment will be described.

FIG. 1 illustrates a schematic view depicting an organic light-emitting device according to an embodiment.

Figure 2:
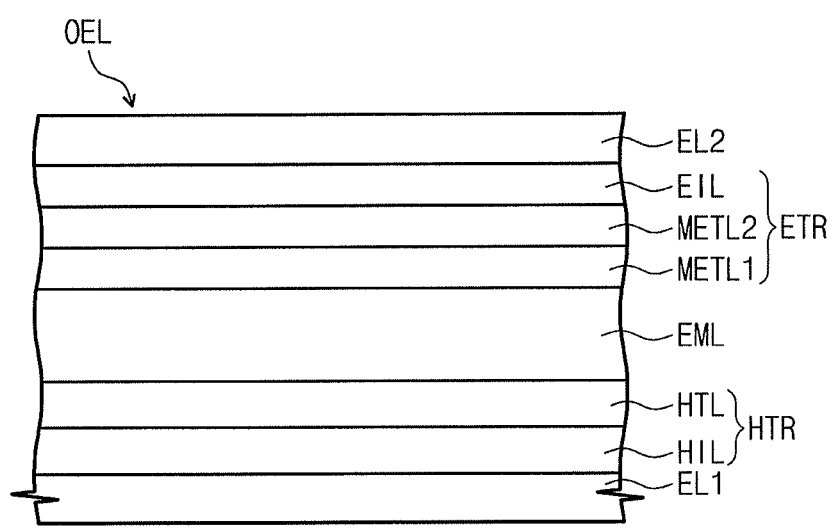
FIG. 2 illustrates a schematic view depicting an organic light-emitting device according to an embodiment.

FIG. 2 illustrates a schematic view depicting an organic light-emitting device according to an embodiment.

Referring to FIGS. 1 and 2, an organic light-emitting device OEL may include a first electrode EL1, a hole transport region HTR, a light-emitting layer EML, an electron transport region ETR, and a second electrode EL2.

The first electrode EL1 layer 100 may have conductivity. The first electrode EL1 may be a pixel electrode or an anode. The first electrode EL1 may be a transmissive electrode, a semi-transmissive electrode, or a reflective electrode. When the first electrode EL1 is a transmissive electrode, the first electrode EL1 may be formed of a transparent metal oxide, for example, indium tin oxide (ITO), indium zinc oxide (IZO), indium gallium zinc oxide (IGZO), or indium tin zinc oxide (ITZO). When the first electrode EL1 is a semi-transmissive electrode or a reflective electrode, the first electrode EL1 may include Ag, Mg, Al, Pt, Pd, Au, Ni, Nd, Ir, Cr, or a mixture of a metal.

An organic layer may be disposed on the first electrode EL1. The organic layer includes the light-emitting layer EML. The organic layer may further include the hole transport region HTR and the electron transport region ETR.

The hole transport region HTR may be provided on the first electrode EL1. The hole transport region HTR may include at least one of a hole injection layer HIL, a hole transport layer, a buffer layer, and an electron blocking layer.

The hole transport region HTR may have a single-layered structure that is formed of a single material, or a single layered structure that is formed of different materials, or a multi-layered structure that has a plurality of layers formed of different materials.

For example, the hole transport region HTR may have a single-layered structure formed of a plurality of different materials, or have any of the following structures: of hole injection layer HIL/hole transport layer HTL; hole injection layer HIL/hole transport layer HTL/buffer layer; hole injection layer HIL/buffer layer; or hole injection layer HIL/hole transport layer HTL/electron blocking layer, the respective layers being stacked in the named order on the first electrode EL1.

The hole transport region HTR may be formed by a suitable method, such as a vacuum deposition method, a spin coating method, a casting method, a Langmuir-Blodgett (LB) method, an inkjet printing method, a laser printing method, or a laser induced thermal imaging (LITI) method.

When the hole transport region HTR includes a hole injection layer HIL, the hole transport region HTR may include, for example, at least one of a phthalocyanine compound such as copper phthalocyanine, N,N'-diphenyl-N,N-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), a polyaniline/dodecylbenzenesulfonic acid (PANI/DBSA), a polyaniline/camphor sulfonic acid (PANI/CSA), or polyaniline/poly(4-styrenesulfonate) (PANI/PSS).

When the hole transport region HTR includes a hole transport layer HTL, the hole transport region HTR may include, for example, a carbazole derivative such as N-phenyl carbazole or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine (TAPC).

The hole transport region HTR may have a thickness of about 100 Å to about 10,000 Å, or, for example, about 100 Å to about 1,000 Å. When the hole transport region HTR includes both a hole injection layer HIL and a hole transport layer HTL, the hole injection layer HIL may have a thickness of about 100 Å to about 10,000 Å, or, for example, about 100 Å to about 1,000 Å. In addition to, the hole transport layer HTL may have a thickness of about 150 Å to about 2,000 Å, or, for example, about 100 Å to about 1,500 Å. When the thicknesses of the hole transport region HTR, the hole injection layer HIL, and the hole transport layer HTL meet the aforementioned ranges, excellent hole transport characteristics can be obtained without a substantial increase in driving voltage.

The hole transport region HTR may further include a charge generating material in addition to the aforementioned materials in order to improve conductivity. The charge generating material may uniformly or non-uniformly dispersed inside the hole transport region HTR. The charge generating material may be, for example, a p-type dopant material. The p-type dopant material may be one of a quinone derivative, a metal oxide, and a cyano group-containing compound. Examples of the p-type dopant material may include quinone derivatives such as tetracyanoquinodimethane (TCNQ) or 2,3,5,6-tetrafluoro-tetracyanoquinodimethane (F4-TCNQ), and metal oxides such as a tungsten oxide or a molybdenum oxide.

As described above, the hole transport region HTR may further include at least one of a buffer layer and an electron blocking layer in addition to the hole transport layer HTL and the hole injection layer HIL. The buffer layer may compensate for a resonant distance according to a wavelength of light emitting from the light-emitting layer EML to improve light emission efficiency. A material included in the buffer layer may be one of those included in the hole transport region HTR, as described above. The electron blocking layer is a layer that may help to prevent an injection of electrons from the electron transport region ETR to the hole transport region HTR.

The light-emitting layer EML may be provided on the hole transport region HTR. The light-emitting layer EML may have a multi-layer structure including a single layer formed of a single material, a single layer formed of a plurality of different materials, or a multi-layer formed of a plurality of different materials.

The light-emitting layer EML may be formed by a suitable method such as a vacuum deposition method, a spin coating method, a casting method, a Langmuir-Blodgett (LB) method, an inkjet printing method, a laser printing method, and a laser induced thermal imaging (LITI) method.

The light-emitting layer EML may be formed of, for example, a suitable material that emits red, green, or blue light. The light-emitting layer EML may include a fluorescent material or a phosphorescent material. The light-emitting layer EML may include a host material or a dopant material.

The host material may be, for example, a suitable host material such as tris(8-quinolinolato)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

When the light-emitting layer EML emits red light, the light-emitting layer EML may include, for example, PBD: Eu(DBM)$_3$(Phen)(tris(dibenzoylmethanato) phenanthroline europium) or perylene. When the light-emitting layer EML emits red light, the dopant material included in the light-emitting layer EML may be selected from, for example, a metal complex such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), or an organometallic complex.

When the light-emitting layer EML emits green light, the light-emitting layer EML may include a florescent material that includes, for example, tris(8-hydroxyquinolino)aluminum (Alq3). When the light-emitting layer EML emits green light, the dopant material included in the light-emitting layer EML may be selected from, for example, a metal complex such as fac-tris(2-phenylpyridine)iridium (Ir(ppy)$_3$) or an organometallic complex.

When the light-emitting layer EML emits blue light, the light-emitting layer EML may include a florescent material that includes any one selected from the group of, for example, spiro-DPVBi, Spiro-6P, distyryl-benzene (DSB), distyryl-arylene (DSA), a polyfluorene (PFO)-based polymer, and a poly(p-phenylene vinylene) (PPV)-based polymer. When the light-emitting layer EML emits blue light, the dopant material included in the light-emitting layer EML may be selected from, for example, a metal complex such as (4,6-F$_2$ppy)$_2$Irpic or an organometallic complex.

The electron transport region ETR may be provided on the light-emitting layer EML. The electron transport region ETR may be formed by a suitable method, such as a vacuum deposition method, a spin coating method, a casting method, a Langmuir-Blodgett (LB) method, an inkjet printing method, a laser printing method, or a laser induced thermal imaging (LITI) method.

The electron transport region ETR may include a first mixed electron transport layer METL1 and a second mixed electron transport layer METL2. The first mixed electron transport layer METL1 may be provided on the light-emitting layer EML. The first mixed electron transport layer METL1 includes a first electron transport compound and a second electron transport compound. The second mixed electron transport layer METL2 may be provided on the first mixed electron transport layer METL1. The second mixed electron transport layer METL2 may include the first electron transport compound and a third electron transport compound.

The first electron transport compound may transport electrons of the electron transport region ETR to the light-emitting layer EML. The highest occupied molecular orbital (HOMO) value of the first electron transport compound may be greater than the HOMO value of the second electron transport compound.

The first electron transport compound may be, for example, at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq2), and 9,10-di(naphthalene-2-yl)anthracene (ADN).

The second electron transport compound may help to prevent hole injection from the light-emitting layer EML to the electron transport region ETR. Accordingly, the HOMO value of the second electron transport compound may be smaller than the HOMO value of the first electron transport compound.

The second electron transport compound is different from the first electron transport compound. The second electron transport compound may be at least one of LiF, lithium quinolate (LiQ), Li$_2$O, BaO, NaCl, CsF, Yb, RbCl, and RbI.

The third electron transport compound may reduce an energy difference between the first electron transport compound and the compound included in the electron injection layer EIL to facilitate electron transport from the electron injection layer EIL to the first mixed electron transport layer METL1. Therefore, the lowest unoccupied molecular orbital (LUMO) value of the third electron transport compound may be greater than the LUMO value of the first electron transport compound. Also, the lowest unoccupied molecular orbital (LUMO) value of the third electron transport compound may be smaller than the LUMO value of the compound included in the electron injection layer EIL.

The third electron transport compound is different from each of the first electron transport compound and the second electron transport compound. The third electron transport compound may be at least one of LiF, lithium quinolate (LiQ), $Li_2O$, BaO, NaCl, CsF, Yb, RbCl, and RbI.

The electron transport region ETR may further include at least one of an electron injection layer EIL and a hole blocking layer.

When the electron transport region ETR includes the electron injection layer EIL, the electron transport region ETR may include LiF, lithium quinolate (LiQ). $Li_2O$. BaO, NaCl, CsF, or a lanthanide group metal such as Yb, or a metal halide such as RbCl or RbI, as examples. The electron injection layer EIL may be formed of a material in which an electron transport material and an organic metal salt having an insulation property are mixed. The organic metal salt may be a material having an energy band gap of about 4 eV or more. For example, the organic metal salt may include a metal acetate, a metal benzoate, a metal acetoacetate, a metal acetylacetonate, or a metal stearate. The electron injection layer EIL may have a thickness of about 1 Å to about 100 Å, or about 3 Å to about 90 Å. When the thickness of the electron injection layer EIL is within the aforementioned range, excellent hole injection characteristics may be obtained without a substantial increase in driving voltage.

The electron transport region ETR may include a hole blocking layer as described above. The hole blocking layer may include, for example, at least one of 2,9-dimethyl-4,7-diphenyl-1,10-phenanthroline (BCP) and 4,7-diphenyl-1,10-phenanthroline (Bphen). The hole blocking layer may have a thickness of about 20 Å to about 1,000 Å, or, for example, about 30 Å to about 300 Å. When the thickness of the hole blocking layer is within the aforementioned range, excellent hole blocking characteristics may be obtained without a substantial increase in driving voltage.

The second electrode EL2 may be provided on the electron transport region ETR. The second electrode EL2 may be a common electrode or a cathode. The second electrode EL2 may be a transmissive electrode, a semi-transmissive electrode, or a reflective electrode.

When the second electrode EL2 is a transmissive electrode, the second electrode EL2 may include Li, Ca, LiF/Ca, LiF/Al, Al, Mg, BaF, Ba, Ag, or a compound or a mixture thereof (for example, a mixture of Ag and Mg).

The second electrode EL2 may include an auxiliary electrode. The auxiliary electrode may include a film that is formed by depositing the aforementioned material so as to face the light-emitting layer EML, a transparent metal oxide on the film, such as indium tin oxide (ITO), indium zinc oxide (IZO), indium gallium zinc oxide (IGZO), indium tin zinc oxide, or indium tin zinc oxide (ITZO), Mo, or Ti.

When the second electrode EL2 is a semi-transmissive electrode or a reflective electrode, the second electrode EL2 may include at least one of LiAg, Mg, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some implementations, the second electrode EL2 may have a multi-layered structure that includes a reflective or a semi-transmissive film formed of the aforementioned material, and a transparent conductive film formed of indium tin oxide (ITO), indium zinc oxide (IZO), zinc oxide (ZnO), indium tin zinc oxide (ITZO) or the like.

When the organic light-emitting device OEL is a top emission type organic light-emitting device, the first electrode EL1 may be a reflective electrode, and the second electrode EL2 may be a transmissive electrode or a semi-transmissive electrode. When the organic light-emitting diode OEL is a bottom emission type organic light-emitting device, the first electrode EL1 may be a transmissive electrode or a semi-transmissive electrode, and the second electrode EL2 may be a reflective electrode.

In the organic light-emitting device according to an embodiment, as voltage is applied to each of the first electrode EL1 and the second electrode EL2, holes injected from the first electrode EL1 may be transferred to the light-emitting layer EML via the hole transport region HTR, and electrons injected from the second electrode EL2 may be transferred to the light-emitting layer EML via the electron transport region ETR. Electrons and holes may be re-combined in the light-emitting layer EML to generate excitons, and the excitons may transition from an excited state to a ground state to emit light.

A transfer rate of electrons in a general organic light-emitting device may be slower than a transfer rate of holes. Band gaps may be respectively generated between an energy band of a hole transport region and an energy band of a light-emitting layer, and between the energy band of the light-emitting layer and an energy band of an electron transport layer. A recombination rate of electrons and holes may be decreased, such that hole injection and electron injection into the light-emitting layer may become difficult, and light emission efficiency may be reduced.

The organic light-emitting device according to an embodiment includes the first mixed electron transport layer that includes the first electron transport compound and the second electron transport compound and the second mixed electron transport layer that includes the first electron transport compound and the third electron transport compound. A band gap between an energy band of the hole transport region and an energy band of the light-emitting layer may be reduced, and the injection of holes into the light-emitting layer may be facilitated. Also. A band gap between the energy band of the light-emitting layer and an energy band of the electron transport region may be reduced, and the injection of electrons into the light-emitting layer may be facilitated. Accordingly, the organic light-emitting diode according to an embodiment may have high efficiency and a long lifespan.

Hereinafter, a display apparatus according to an embodiment will be described. Hereinafter, points that differ from the above-mentioned organic light-emitting device OEL according to an embodiment will be mainly described in detail, and it is to be understood that elements that are not described in detail may be the same as in the organic light-emitting device OEL according to an embodiment.

Figure 3:
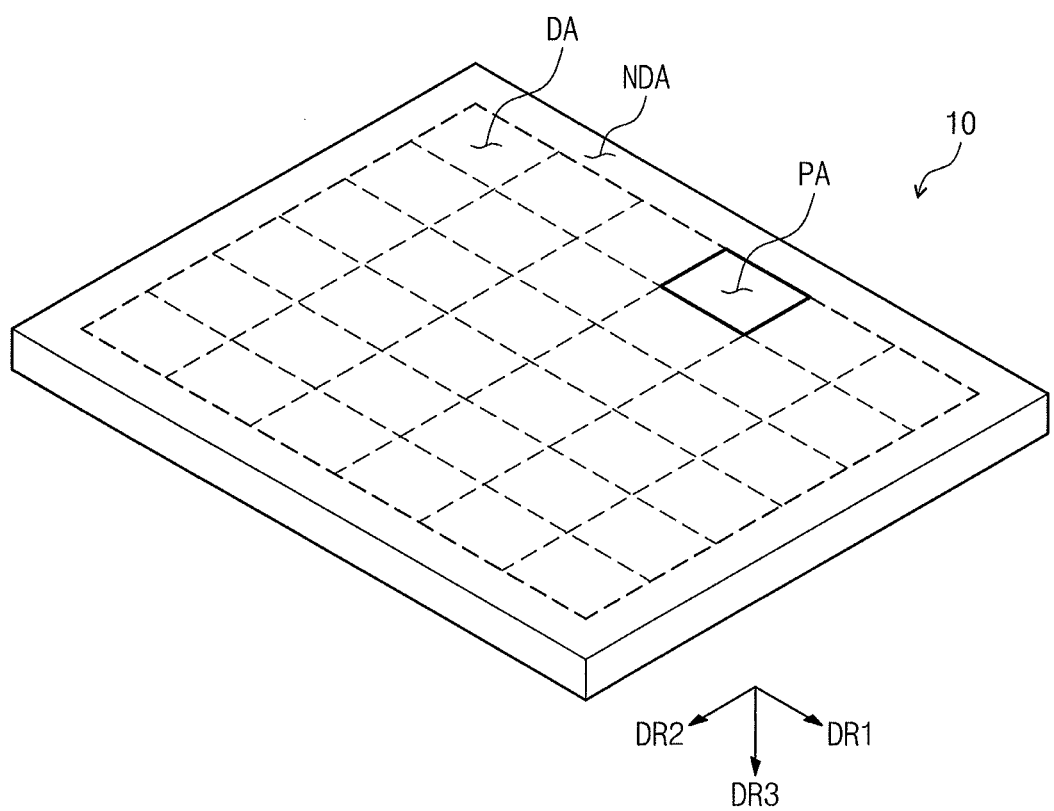
FIG. 3 illustrates a perspective view depicting a display apparatus according to an embodiment.

FIG. 3 illustrates a perspective view depicting a display apparatus 10 according to an embodiment.

Referring to FIG. 3, a display apparatus 10 according to another embodiment may include a display region DA and a non-display region NDA.

The display region DA may display an image. The display region DA may have an approximately rectangular shape as viewed from a thickness direction of the display apparatus 10 (for example, DR3).

The display region DA may include a plurality of pixel regions PA. The pixel regions PA may be arranged in a matrix configuration. The pixel regions PA may be defined by a pixel defining film (PDL of FIG. 6). The pixel regions PA may include a plurality of pixels (PX of FIG. 4), respectively.

The non-display region NDA does not display an image. The non-display region NDA may surround, for example, the display region DA as viewed from the thickness direction DR3 of the display apparatus 10. The non-display region NDA may be adjacent to the display region DA in a first direction (for example, DR1) and in a second direction (for example, DR2) intersecting with the first direction (for example, DR1)

Figure 4:
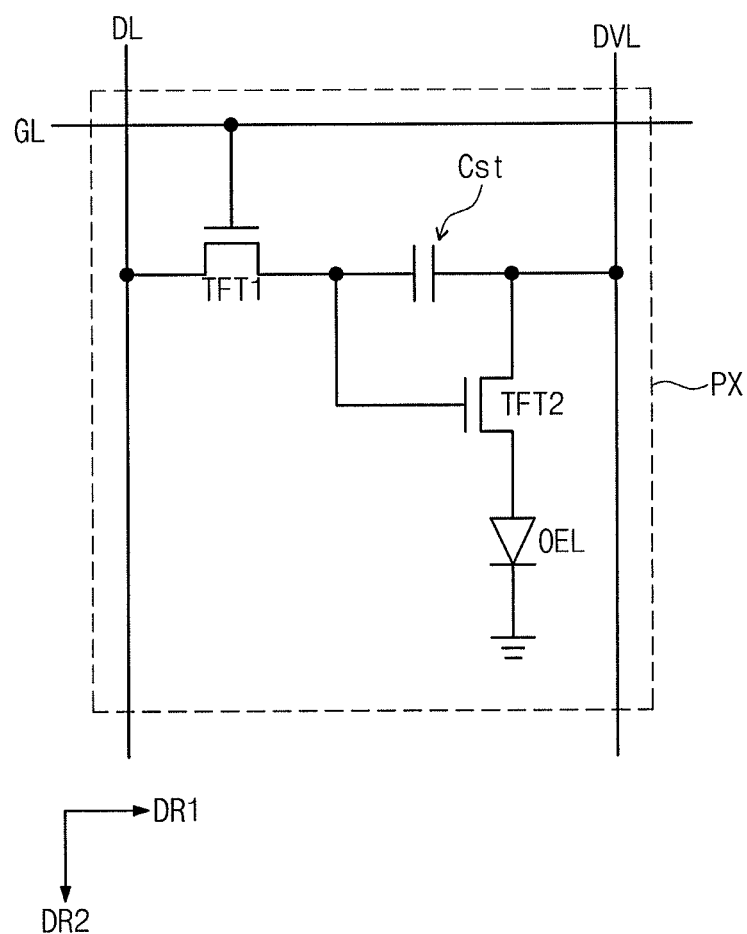
FIG. 4 illustrates a circuit diagram showing one of pixels included in a display apparatus according to an embodiment.
Figure 5:
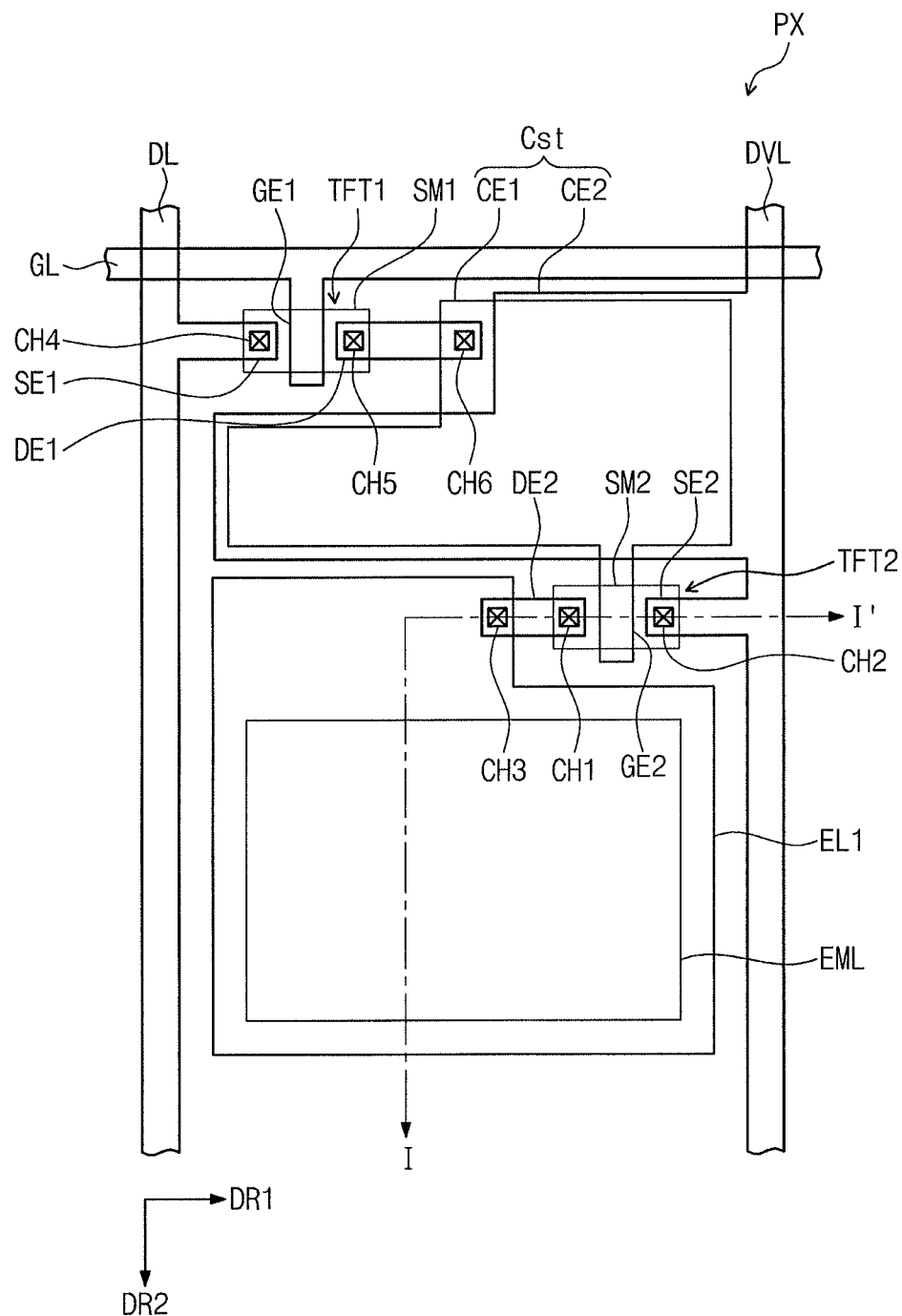
FIG. 5 illustrates a plan view depicting one of pixels included in a display apparatus according to an embodiment.
Figure 6:
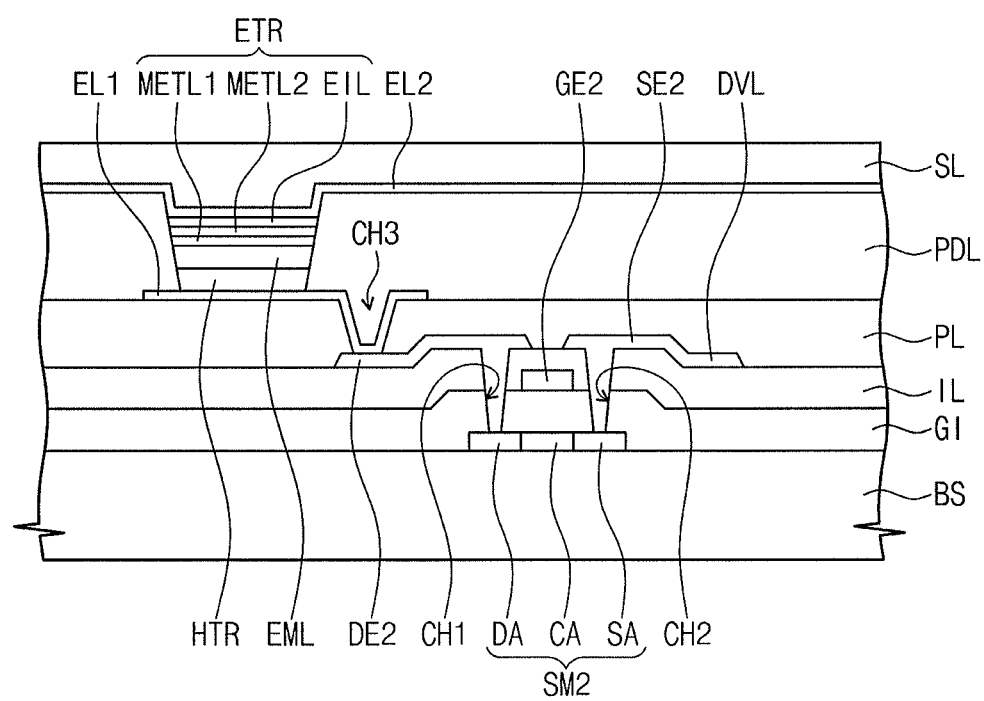
FIG. 6 illustrates a schematic cross-sectional view taken along line I-I' of FIG. 5.

FIG. 4 illustrates a circuit diagram showing one of pixels included in a display apparatus 10 according to an embodiment;

FIG. 5 illustrates a plan view depicting one of pixels included in a display apparatus 10 according to an embodiment;

FIG. 6 illustrates a schematic cross-sectional view taken along line I-I' of FIG. 5.

Referring to FIGS. 4 to 6, each of pixels PX may include a wiring unit including a gate line GL, a data line DL, and a driving voltage line DVL, thin film transistors TFT1 and TFT2 connected to the wiring unit, an organic light-emitting device OEL connected to the thin film transistor, and a capacitor Cst.

Each of the pixels PX may emit specific color of light, for example, red light, green light, or blue light. In some implementations, the pixels may emit, cyan light, magenta light, or yellow light.

The gate line GL may extend in the first direction DR1. The data line DL may extend in the second direction intersecting with the gate line GL. The driving voltage line DVL may extend in a direction that is substantially the same as the data line DL, i.e., in the second direction DR2. The gate line GL may transfer a scanning signal to the thin film transistors TFT1 and TFT2. The data line DL may transfer a data signal to the thin film transistors TFT1 and TFT2. The driving voltage line DVL may apply a driving voltage to the thin film transistors TFT1 and TFT2.

The thin film transistors TFT1 and TFT2 may include a driving thin film transistor TFT2 that controls the organic light-emitting device OEL, and a switching thin film transistor TFT1 that switches the driving thin film transistor TFT2. While it is described in an embodiment that each of pixels PX includes two transistors TFT1 and TFT2, In other implementations each of pixels PX may include one thin film transistor and one capacitor, or may include at least three thin film transistors and at least two capacitors.

The switching thin film transistor TFT1 may include a first gate electrode GE1, a first source electrode SE1, and a first drain electrode DE1. The first gate electrode GE1 may be connected to the gate line GL, and the first source electrode SE1 may be connected to the data line DL. The first drain electrode DE1 may be connected to a first common electrode CE1 through a fifth contact hole CH5. The switching thin film transistor TFT1 may transfer a data signal applied to the data line DL to the driving thin film transistor TFT2 according to a scanning signal applied to the gate line GL.

The driving thin film transistor TFT2 may include a second gate electrode GE2, a second source electrode SE2, and a second drain electrode DE2. The second gate electrode GE2 may be connected to the first common electrode CE1. The second source electrode SE2 may be connected to the driving voltage line DVL. The second drain electrode DE2 may be connected to the first electrode EL1 through a third contact hole CH3.

The first electrode EL1 may be connected to the second drain electrode DE2 of the driving thin film transistor TFT2. A common voltage may be applied to the second electrode EL2. The light-emitting layer EML may emit blue light according to an output signal of the driving thin film transistor TFT2 to display an image. The first electrode EL1 and the second electrode EL2 will be described in more detail below.

The capacitor Cst may be connected between the second gate electrode GE2 and the second source electrode SE2 of the driving thin film transistor TFT2. The capacitor Cst may charge and maintain a data signal inputted to the second gate electrode GE2 of the driving thin film transistor TFT2. The capacitor Cst may include a first common electrode connected CE1 to the first drain electrode DE1 through a sixth contact hole CH6, and a second common electrode CE2 connected to the driving voltage line DVL.

Referring to FIGS. 5 and 6, the display apparatus 10 according to an embodiment may include a base substrate BS on which the thin film transistors and the organic light-emitting device OEL are stacked. The base substrate BS may be selected considering mechanical strength, thermal stability, transparency, surface smoothness, tractability, and water resistance. The base substrate BS may be formed of a suitable insulation material, such as glass, plastic, or quartz. Examples of an organic polymer forming the base substrate BS may include polyethylene terephthalate (PET), polyethylene naphthalate (PEN), polyimide, polyethersulfone, or the like. The base substrate BS.

A substrate buffer layer may be provided on the base substrate BS. The substrate buffer layer may prevent impurities from being diffused into the switching and driving thin film transistors TFT1 and TFT2. The substrate buffer layer may be formed of silicon nitride ($SiN_x$), silicon oxide ($SiO_x$), silicon oxynitride ($SiO_xN_y$) or the like. In some implementations, according to a material of the base substrate BS and a process condition, the substrate buffer layer may be omitted.

A first semiconductor layer SM1 and a second semiconductor layer SM2 may be provided on the base substrate BS. The first semiconductor layer SM1 and the second semiconductor layer SM2 may be formed of a semiconductor material and may operate as active layers of the switching thin film transistor TFT1 and the driving thin film transistor TFT2, respectively. Each of the first semiconductor layer SM1 and the second semiconductor layer SM2 may include a source region SA, a drain region DA, and a channel region CA provided between the source region SA and the drain region DA. Each of the first semiconductor layer SM1 and the second semiconductor layer SM2 may be formed of a material selected from inorganic semiconductor materials and organic semiconductor materials. The source region SA and the drain region DA may be doped with n-type impurities or p-type impurities.

A gate insulation layer GI may be provided on each of the first semiconductor layer SM1 and the second semiconductor layer SM2. The gate insulation layer GI may cover the first semiconductor layer SM1 and the second semiconductor layer SM2. The gate insulation layer GI may be formed of an organic insulation material or an inorganic insulation material.

A first gate electrode GE1 and a second gate electrode GE2 may be provided on the gate insulation layer GI. The first gate electrode GE1 and the second gate electrode GE2 may be formed to cover regions corresponding to channel regions CA of the first semiconductor layer SM1 and the second semiconductor layer SM2, respectively.

An interlayer insulating layer IL may be provided on the first gate electrode GE1 and the second gate electrode GE2. The interlayer insulating layer IL may cover the first gate electrode GE1 and the second gate electrode GE2. The interlayer insulating layer IL may be formed of an organic insulation material or an inorganic insulation material.

A first source electrode SE1, a first drain electrode DE1, a second source electrode SE2, and a second drain electrode DE2 may be provided on the interlayer insulating layer IL. The second drain electrode DE2 may contact the drain region DA of the second semiconductor layer SM2 through a first contact hole CH1 formed on the gate insulation layer GI and the interlayer insulating layer IL. The second source electrode SE2 may contact the source region SA of the second semiconductor layer SM2 through a second contact hole CH2 formed on the gate insulation layer GI and the interlayer insulating layer IL. The first source electrode SE1 may contact a source region of the first semiconductor layer SM1 through a fourth contact hole CH4 formed on the gate insulation layer GI and the interlayer insulating layer IL. Also, the first drain electrode DE1 may contact a drain region of the first semiconductor layer SM1 through the fifth contact hole CH5 formed on the gate insulation layer GI and the interlayer insulating layer IL.

A passivation layer PL may be provided on the first source electrode SE1, the first drain electrode DE1, the second source electrode SE2, and the second drain electrode DE2. The passivation layer PL may function as a protection film for protecting the switching and driving thin film transistors TFT1 and TFT2 and may function as a planarizing film to planarize upper surfaces of the switching and driving thin film transistors TFT1 and TFT2.

The first electrode EL1 may be provided on the passivation layer PL. The first electrode EL1 may be an anode. The first electrode EL1 may be connected to the second drain electrode DE2 of the driving thin film transistor TFT2 through the third contact hole formed on the passivation layer PL.

A pixel defining film PDL defining pixel regions (PA of FIG. 3) may be provided on the passivation layer PL so as to correspond to each of pixels PX. The pixel defining film PDL may expose an upper surface of the first electrode EL1 and may protrude from the base substrate BS along an edge of each pixel PX. The pixel defining film PDL may include, for example, a metal-fluoride ionic compound. In some implementations, the pixel defining film PDL may be formed of at least one metal-fluoride ionic compound of LiF, $BaF_2$, and CsF. When the metal-fluoride ionic compound has a predetermined thickness, the metal-fluoride ionic compound may have an insulation characteristic. The pixel defining film PDL may have a thickness of, for example, about 10 µm to about 100 µm.

An organic light-emitting device OEL may be provided on each of pixel regions (PA of FIG. 3) surrounded by the pixel defining film PDL. The organic light-emitting device OEL may include a first electrode EL1, a hole transport region HTR, a light-emitting layer EML, an electron transport region ETR, and a second electrode EL2.

The first electrode EL1 may have conductivity. The first electrode EL1 may be a pixel electrode or an anode. The first electrode EL1 may be a transmissive electrode, a semi-transmissive electrode, or a reflective electrode. When the first electrode EL1 is a transmissive electrode, the first electrode may be formed of a transparent metal oxide, for example, indium tin oxide (ITO), indium zinc oxide (IZO), indium gallium zinc oxide (IGZO), or indium tin zinc oxide (ITZO). When the first electrode EL1 is a semi-transmissive electrode or a reflective electrode, the first electrode EL1 may include at least one of Ag, Mg, Al, Pt, Pd, Au, Ni, Nd, Ir, Cr, or a mixture thereof.

An organic layer may be disposed on the first electrode EL1. The organic layer includes a light-emitting layer EML. The organic layer may further include the hole transport region HTR and the electron transport region ETR.

The hole transport region HTR may be provided on the first electrode EL1. The hole transport region HTR may include at least one of a hole injection layer HIL, a hole transport layer, a buffer layer, and an electron blocking layer.

The hole transport region HTR may have a multi-layered structure that has a single layer formed of a single material, a single layer formed of a plurality of different materials, or a multi-layer formed of a plurality of different materials.

For example, the hole transport region HTR may have a single-layered structure that is formed of a plurality of different materials, or have any one the following structures of hole injection layer HIL/hole transport layer HTL; hole injection layer HIL/hole transport layer HTL/buffer layer; hole injection layer HIL/buffer layer; or hole injection layer HIL/hole transport layer HTL/electron blocking layer, the respective layers being stacked in the named order on the first electrode EL1.

The hole transport region HTR may be formed by a suitable method, such as a vacuum deposition method, a spin coating method, a casting method, a Langmuir-Blodgett (LB) method, an inkjet printing method, a laser printing method, or a laser induced thermal imaging (LITI) method.

When the hole transport region HTR includes a hole injection layer HIL, the hole transport region HTR may include at least one of a phthalocyanine compound such as copper phthalocyanine, N,N-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4'4"-tris(N,N-diphenylamino)triphenylamine (TDATA), 4,4',4"-tris{N,-(2-naphthyl)-N-phenylamino}-triphenylamine (2TNATA), poly(3,4-ethylenedioxythiophene)/poly(4-styrenesulfonate) (PEDOT/PSS), a polyaniline/dodecylbenzenesulfonic acid (PANI/DBSA), a polyaniline/camphor sulfonic acid (PANI/CSA), or polyaniline/poly(4-styrenesulfonate) (PANI/PSS).

When the hole transport region HTR includes a hole transport layer HTL, the hole transport region HTR may include, for example, a carbazole derivative such as N-phenyl carbazole or polyvinyl carbazole, a fluorene-based derivative, a triphenylamine-based derivative such as N,N'-bis(3-methylphenyl)-N,N'-diphenyl-[1,1-biphenyl]-4,4'-diamine (TPD) or 4,4',4"-tris(N-carbazolyl)triphenylamine (TCTA), N,N'-di(1-naphthyl)-N,N'-diphenylbenzidine (NPB), or 4,4'-cyclohexylidene bis[N,N-bis(4-methylphenyl)benzenamine (TAPC).

The hole transport region HTR may have a thickness of about 100 Å to about 10,000 Å, or, for example, about 100 Å to about 1,000 Å. When the hole transport region HTR includes both a hole injection layer HIL and a hole transport layer HTL, the hole injection layer HIL may have a thickness of about 100 Å to about 10,000 Å, or, for example, about 100 Å to about 1,000 Å. In addition, the hole transport layer HTL may have a thickness of about 150 Å to about 2,000 Å, or, for example, about 100 Å to about 1,500 Å. When the thicknesses of the hole transport region, the hole injection layer HIL, and the hole transport layer HTL meet the aforementioned ranges, excellent hole transporting characteristics may be obtained without a substantial increase in driving voltage.

The hole transport region HTR may further include a charge generating material in addition to the aforementioned materials in order to improve conductivity. The charge generating material may be uniformly or non-uniformly dispersed inside the hole transport region HTR. The charge generating material may be, for example, a p-type dopant material. The p-type dopant material may be one of a quinone derivative, a metal oxide, and a cyano group-containing compound. Examples of the p-type dopant material may include quinone derivatives such as tetracyanoquinodimethane (TCNQ) or 2,3,5,6-tetrafluoro-tetracyanoquinodimethane (F4-TCNQ), and metal oxides such as a tungsten oxide or a molybdenum oxide.

As described above, the hole transport region HTR may include at least one of the buffer layer and the electron blocking layer in addition to the hole transport layer HTL and the hole injection layer HIL. The buffer layer may compensate for a resonant distance according to a wavelength of light emitting from the light-emitting layer EML to improve light emission efficiency. A material included in the buffer layer may be one of those included the hole transport region HTR. The electron blocking layer is a layer may help to prevent an injection of electrons from the electron transport region ETR to the hole transport region HTR.

The light-emitting layer EML may be provided on the hole transport region HTR. The light-emitting layer EML may have a multi-layered structure that has a single layer formed of a single material, a single layer formed of a plurality of different materials, or a multi-layer formed of a plurality of different materials.

The light-emitting layer EML may be formed by a suitable method such as a vacuum deposition method, a spin coating method, a casting method, a Langmuir-Blodgett (LB) method, an inkjet printing method, a laser printing method, or a laser induced thermal imaging (LITI) method.

The light-emitting layer 130 may be formed of a suitable light-emitting material, for example, a material that emits red, green, or blue light. The light-emitting material may include a fluorescent material or a phosphorescent material. The light-emitting layer EML may include a host material or a dopant material.

The host material may include a suitable host material such as tris(8-quinolinolato)aluminum (Alq3), 4,4'-bis(N-carbazolyl)-1,1'-biphenyl (CBP), poly(n-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazole-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), or 2-methyl-9,10-bis(naphthalen-2-yl)anthracene (MADN).

When the light-emitting layer EML emits red light, the light-emitting layer EML may include, for example, PBD: Eu(DBM)$_3$(Phen)(tris(dibenzoylmethanato) phenanthroline europium) or perylene. When the light-emitting layer EML emits red light, the dopant material included in the light-emitting layer EML may be selected from, for example, a metal complex such as bis(1-phenylisoquinoline) acetylacetonate iridium (PIQIr(acac)), bis(1-phenylquinoline)acetylacetonate iridium (PQIr(acac)), tris(1-phenylquinoline)iridium (PQIr), and octaethylporphyrin platinum (PtOEP), or an organometallic complex.

When the light-emitting layer EML emits green light, the light-emitting layer EML may include a florescent material that includes, for example, tris(8-hydroxyquinolino)aluminum (Alq3). When the light-emitting layer EML emits green light, the dopant included in the light-emitting layer EML may be selected from, for example, a metal complex such as fac-tris(2-phenylpyridine)iridium (Ir(ppy)3) or an organometallic complex.

When the light-emitting layer EML emits blue light, the light-emitting layer EML may include a florescent material that includes any one selected from the group of, for example, spiro-DPVBi, spiro-6P, distyryl-benzene (DSB), distyryl-arylene (DSA), a polyfluorene (PFO)-based polymer, and a poly(p-phenylene vinylene) (PPV)-based polymer. When the light-emitting layer EML emits blue light, the dopant material included in the light-emitting layer EML may be selected from, for example, a metal complex such as (4,6-F$_2$ppy)$_2$Irpic or an organometallic complex.

The electron transport region ETR may be provided on the light-emitting layer EML. The electron transport region ETR may be formed by a suitable method such as a vacuum deposition method, a spin coating method, a casting method, a Langmuir-Blodgett (LB) method, an inkjet printing method, a laser printing method, or a laser induced thermal imaging (LITI) method.

The electron transport region ETR may include a first mixed electron transport layer METL1 and a second mixed electron transport layer METL2. The first mixed electron transport layer METL1 may be provided on the light-emitting layer EML. The first mixed electron transport layer METL1 may include a first electron transport compound and a second electron transport compound. The second mixed electron transport layer METL2 may be provided on the first mixed electron transport layer METL1. The second mixed electron transport layer METL2 may include the first electron transport compound and a third electron transport compound.

The first electron transport compound may transport electrons of the electron transport region ETR to the light-emitting layer EML. The highest occupied molecular orbital (HOMO) value of the first electron transport compound may be greater than a HOMO value of the second electron transport compound.

The first electron transport compound may be, for example, at least one of tris(8-hydroxyquinolinato)aluminum (Alq3), 1,3,5-tri(1-phenyl-1H-benzo[d]imidazol-2-yl) phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq2), and 9,10-di(naphthalene-2-yl)anthracene (ADN).

The second electron transport compound may help to prevent hole injection from the light-emitting layer EML to the electron transport region ETR. Accordingly, the HOMO value of the second electron transport compound may be smaller than that of the first electron transport compound.

The second electron transport compound is different from the first electron transport compound. The second electron transport compound may be at least one of LiF, lithium quinolate (LiQ), Li$_2$O, BaO, NaCl, CsF, Yb, RbCl, and RbI.

The third electron transport compound may reduce an energy difference between the first electron transport compound and the compound included in the electron injection layer EIL to facilitate electron transport from the electron injection layer EIL to the first mixed electron transport layer METL1. Therefore, the lowest unoccupied molecular orbital (LUMO) value of the third electron transport compound may be greater than the LUMO value of the first electron transport compound. Also, the lowest unoccupied molecular orbital (LUMO) value of the third electron transport compound may be smaller than the LUMO value of a compound included in the electron injection layer EIL.

The third electron transport compound is different from each of the first electron transport compound and the second electron transport compound. The third electron transport compound may be at least one of LiF, lithium quinolate (LiQ), $Li_2O$, BaO, NaCl, CsF, Yb, RbCl, and RbI.

The electron transport region ETR may further include at least one of an electron injection layer EIL and a hole blocking layer.

When the electron transport region ETR includes the electron injection layer EIL, the electron transport region ETR may include, for example, LiF, lithium quinolate (LiQ), $Li_2O$, BaO, NaCl, CsF, or a lanthanide group metal such as Yb, or a metal halide such as RbCl or RbI. The electron injection layer EIL may be formed of a material in which an electron transport material and an organic metal salt having an insulation property are mixed. The organic metal salt may be a material having an energy band gap of about 4 eV or more. For example, the organic metal salt may include a metal acetate, a metal benzoate, a metal acetoacetate, a metal acetylacetonate, or a metal stearate. The electron injection layer EIL may have a thickness of about 1 Å to about 100 Å, or, for example, about 3 Å to about 90 Å. When the thickness of the electron injection layer EIL is within the aforementioned range, excellent electron injection characteristics may be obtained without a substantial increase in driving voltage.

The electron transport region ETR may include a hole blocking layer as described above. The hole blocking layer may include, for example, at least one of 2.9-dimethyl-4,7-diphenyl-1,10-phenanthroline (BCP) and 4,7-diphenyl-1,10-phenanthroline (Bphen). The hole blocking layer may have a thickness of about 20 Å to about 1,000 Å, or, for example, about 30 Å to about 300 Å. When the thickness of the hole blocking layer is within the aforementioned range, excellent hole blocking characteristics may be obtained without a substantial increase in driving voltage.

The second electrode EL2 may be provided on the electron transport region ETR. The second electrode EL2 may be a common electrode or a cathode. The second electrode EL2 may be a transmissive electrode, a semi-transmissive electrode, or a reflective electrode.

When the second electrode EL2 is a transmissive electrode, the second electrode EL2 may include at least one of Li, Ca, LiF/Ca, LiF/Al, Al, Mg, BaF, Ba, Ag, or a compound or a mixture thereof (for example, a mixture of Ag and Mg).

The second electrode EL2 may include an auxiliary electrode. The auxiliary electrode may include a film formed by depositing the aforementioned material so as to face the light-emitting layer EML, a transparent metal oxide on the film, such as indium tin oxide (ITO), indium zinc oxide (IZO), indium gallium zinc oxide (IGZO), indium tin zinc oxide, or indium tin zinc oxide (ITZO), Mo, or Ti.

When the second electrode EL2 is a semi-transmissive electrode or a reflective electrode, the second electrode EL2 may include at least one of LiAg, Mg, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). In some implementations, the second electrode EL2 may have a multi-layered structure that includes a reflective or a semi-transmissive film formed of the aforementioned material, and a transparent conductive film formed of indium tin oxide (ITO), indium zinc oxide (IZO), zinc oxide (ZnO), indium tin zinc oxide (ITZO) or the like.

When the organic light-emitting device OEL is a top emission type organic light-emitting, the first electrode EL1 may be a reflective electrode, and the second electrode EL2 may be a transmissive electrode or a semi-transmissive electrode. When the organic light-emitting diode OEL is a bottom emission type organic light-emitting, the first electrode EL1 may be a transmissive electrode or a semi-transmissive electrode, and the second electrode EL2 may be a reflective electrode.

An encapsulation layer SL covering the second electrode EL2 may be provided on the second electrode EL2. The encapsulation layer SL may include at least one of an organic layer or an inorganic layer. The encapsulation layer SL may protect the organic light-emitting device OEL.

A transfer rate of electrons in a general organic light-emitting device may be slower than a transfer rate of holes. Band gaps may be respectively generated between an energy band of the hole transport region and an energy band of the light-emitting layer, and between the energy band of the light-emitting layer and an energy band of the electron transport layer. A recombination rate of electrons and holes in the light-emitting layer may be decreased, such that hole injection and electron injection into the light-emitting layer may be difficult, and light-emitting efficiency may be reduced.

The display apparatus according to an embodiment may include a first mixed electron transport layer that includes a first electron transport compound and a second electron transport compound, and a second mixed electron transport layer that includes the first electron transport compound and a third electron transport compound. A band gap between an energy band of the hole transport region and an energy band of the light-emitting layer, and a band gap between the energy band of the light-emitting layer and an energy band of the electron transport layer of the display apparatus may be reduced. Injection of holes into the light-emitting layer may be facilitated. Also, a band gap between the energy band of the light-emitting layer and an energy band of the electron transport region may be reduced, and injection of electrons into the light-emitting layer may be facilitated. Accordingly, it may be possible to provide a display apparatus and an organic light-emitting device having high efficiency and a long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:
a first electrode;
a hole transport region on the first electrode;
a light-emitting layer on the hole transport region;
an electron transport region on the light-emitting layer; and
a second electrode on the electron transport region,
wherein the electron transport region includes:
a first mixed electron transport layer; and
a second mixed electron transport layer on the first mixed electron transport layer,
wherein the first mixed electron transport layer includes:
a first electron transport compound; and
a second electron transport compound different from the first electron transport compound; and
the second mixed electron transport layer includes:
the first electron transport compound; and
a third electron transport compound different from the first electron transport compound and the second electron transport compound.

2. The organic light-emitting device as claimed in claim 1, wherein the first electron transport compound is at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) (Bebq2), and 9,10-di(naphthalene-2-yl)anthracene (ADN).

3. The organic light-emitting device as claimed in claim 1, wherein each of the second electron transport compound and the third electron transport compound is at least one of LiF, lithium quinolate (LiQ), $Li_2O$, BaO, NaCl, CsF, Yb, RbCl, and RbI.

4. The organic light-emitting device as claimed in claim 1, wherein a highest occupied molecular orbital (HOMO) value of the first electron transport compound is greater than a HOMO value of the second electron transport compound.

5. The organic light-emitting device as claimed in claim 1, wherein a lowest occupied molecular orbital (LUMO) value of the third electron transport compound is greater than a LUMO value of the first electron transport compound.

6. The organic light-emitting device as claimed in claim 1, wherein the electron transport region further includes an electron injection layer on the second mixed electron transport layer.

7. The organic light-emitting device as claimed in claim 6, wherein a LUMO value of a compound included in the electron injection layer is greater than a LUMO value of the third electron transport compound.

8. The organic light-emitting device as claimed in claim 6, wherein the electron injection layer includes at least one selected from the group of LiF, lithium quinolate (LiQ), $Li_2O$, BaO, NaCl, CsF, Yb, RbCl, RbI, a metal acetate, a metal benzoate, a metal acetoacetate, a metal acetylacetonate, and a metal stearate.

9. The organic light-emitting device as claimed in claim 1, wherein the hole transport region includes:
a hole injection layer on the first electrode; and
a hole transport layer on the hole injection layer.

10. The organic light-emitting device as claimed in claim 1, wherein the first electron transport compound is at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), and 9,10-di(naphthalene-2-yl)anthracene (ADN).

11. The organic light-emitting device as claimed in claim 1, wherein each of the second electron transport compound and the third electron transport compound is at least one of LiF, lithium quinolate (LiQ), NaCl, CsF, Yb, RbCl, and RbI.

12. A display apparatus comprising a plurality of pixels, wherein at least one of the plurality of pixels includes:
a first electrode;
a hole transport region on the first electrode;
a light-emitting layer on the hole transport region;
an electron transport region on the light-emitting layer; and
a second electrode on the electron transport region,
wherein the electron transport region includes:
a first mixed electron transport layer; and
a second mixed electron transport layer on the first mixed electron transport layer,
wherein the first mixed electron transport layer includes:
a first electron transport compound; and
a second electron transport compound different from the first electron transport compound; and
the second mixed electron transport layer includes:
the first electron transport compound; and
a third electron transport compound different from each of the first electron transport compound and the second electron transport compound.

13. The display apparatus as claimed in claim 12, wherein the first electron transport compound is at least one of tris(8-hydroxyquinolinato)aluminum (Alq3), 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-naphthalen-1-yl)-3,5-diphenyl-4H-1,2,4-triazolen (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate) (Bebq2), and 9,10-di(naphthalene-2-yl)anthracene (ADN).

14. The display apparatus as claimed in claim 12, wherein each of the second electron transport compound and the third electron transport compound is at least one of LiF, lithium quinolate (LiQ), $Li_2O$, BaO, NaCl, CsF, Yb, RbCl, and RbI.

15. The display apparatus as claimed in claim 12, wherein a highest occupied molecular orbital (HOMO) value of the first electron transport compound is greater than a HOMO value of the second electron transport compound.

16. The display apparatus as claimed in claim 12, wherein a lowest occupied molecular orbital (LUMO) value of the third electron transport compound is greater than a LUMO value of the first electron transport compound.

17. The display apparatus as claimed in claim 12, wherein the electron transport region further includes an electron injection layer on the second mixed electron transport layer.

18. The display apparatus as claimed in claim 17, wherein a LUMO value of a compound included in the electron injection layer is greater than a LUMO value of the third electron transport compound.

19. The display apparatus as claimed in claim 17, wherein the electron injection layer includes at least one selected from the group of LiF, lithium quinolate (LiQ), $Li_2O$, BaO, NaCl, CsF, Yb, RbCl, RbI, metal acetate, metal benzoate, metal acetoacetate, metal acetylacetonate, and metal stearate.

20. The display apparatus as claimed in claim 12, wherein the hole transport region includes:
 a hole injection layer on the first electrode; and
 a hole transport layer on the hole injection layer.

\* \* \* \* \*